United States Patent [19]

Forster et al.

[11] Patent Number: 5,685,941
[45] Date of Patent: Nov. 11, 1997

[54] INDUCTIVELY COUPLED PLASMA REACTOR WITH TOP ELECTRODE FOR ENHANCING PLASMA IGNITION

[75] Inventors: John Forster, San Francisco; Barney M. Cohen, San Jose; Bradley O. Stimson; George Proulx, both of Mountain View, all of Calif.

[73] Assignee: Applied Materials, Inc., Santa Clara, Calif.

[21] Appl. No.: 561,144

[22] Filed: Nov. 21, 1995

Related U.S. Application Data

[63] Continuation of Ser. No. 252,963, Jun. 2, 1994.

[51] Int. Cl.$^6$ .................... H01L 21/00; C23C 14/34
[52] U.S. Cl. ............. 156/345; 204/298.31; 204/298.34; 204/298.38; 118/723 I; 118/723 IR; 118/723 E
[58] Field of Search ............ 204/298.31, 298.34, 204/298.38; 118/723 I, 723 IR, 723 R, 723 E, 723 MW; 156/345

[56] References Cited

U.S. PATENT DOCUMENTS

| | | | |
|---|---|---|---|
| 4,786,352 | 11/1988 | Benzing | 204/298.34 |
| 4,795,880 | 1/1989 | Hayes et al. | 156/345 |
| 4,844,775 | 7/1989 | Keeble | 204/298.34 |
| 4,918,031 | 4/1990 | Flamm et al. | 437/225 |
| 5,252,178 | 10/1993 | Moslehi | 204/298.34 |
| 5,346,578 | 9/1994 | Benzing et al. | 156/345 |
| 5,449,432 | 9/1995 | Hanawa | 118/723 E |
| 5,460,707 | 10/1995 | Wellerdieck | 156/345 |

FOREIGN PATENT DOCUMENTS

| | | |
|---|---|---|
| 0 467 046 | 1/1992 | European Pat. Off. . |
| 0 520 519 A1 | 12/1992 | European Pat. Off. . |
| 0520519 | 12/1992 | European Pat. Off. . |
| 0 552 490 | 7/1993 | European Pat. Off. . |
| 1 461 636 | 1/1977 | United Kingdom . |

*Primary Examiner*—R. Bruce Breneman
*Assistant Examiner*—Rodney G. McDonald
*Attorney, Agent, or Firm*—Michaelson & Wallace

[57] ABSTRACT

A plasma reactor for carrying out plasma processing of a semiconductor substrate includes a vacuum chamber including apparatus for introducing a gas into the interior thereof, an induction coil encircling a region of the vacuum chamber, the coil being connected across an RF power source, and an electrode positioned adjacent the region and connected to the RF power source for capacitively coupling RF power to the gas in the interior of the vacuum chamber. The electrode has a surface area facing the region which is large enough to provide capacitive coupling of RF power to the gas in the region sufficient to facilitate igniting a plasma, but which is small enough so that, during steady-state maintenance of the plasma, most of the RF power coupled to the plasma from the RF power source is coupled inductively rather than capacitively.

45 Claims, 4 Drawing Sheets

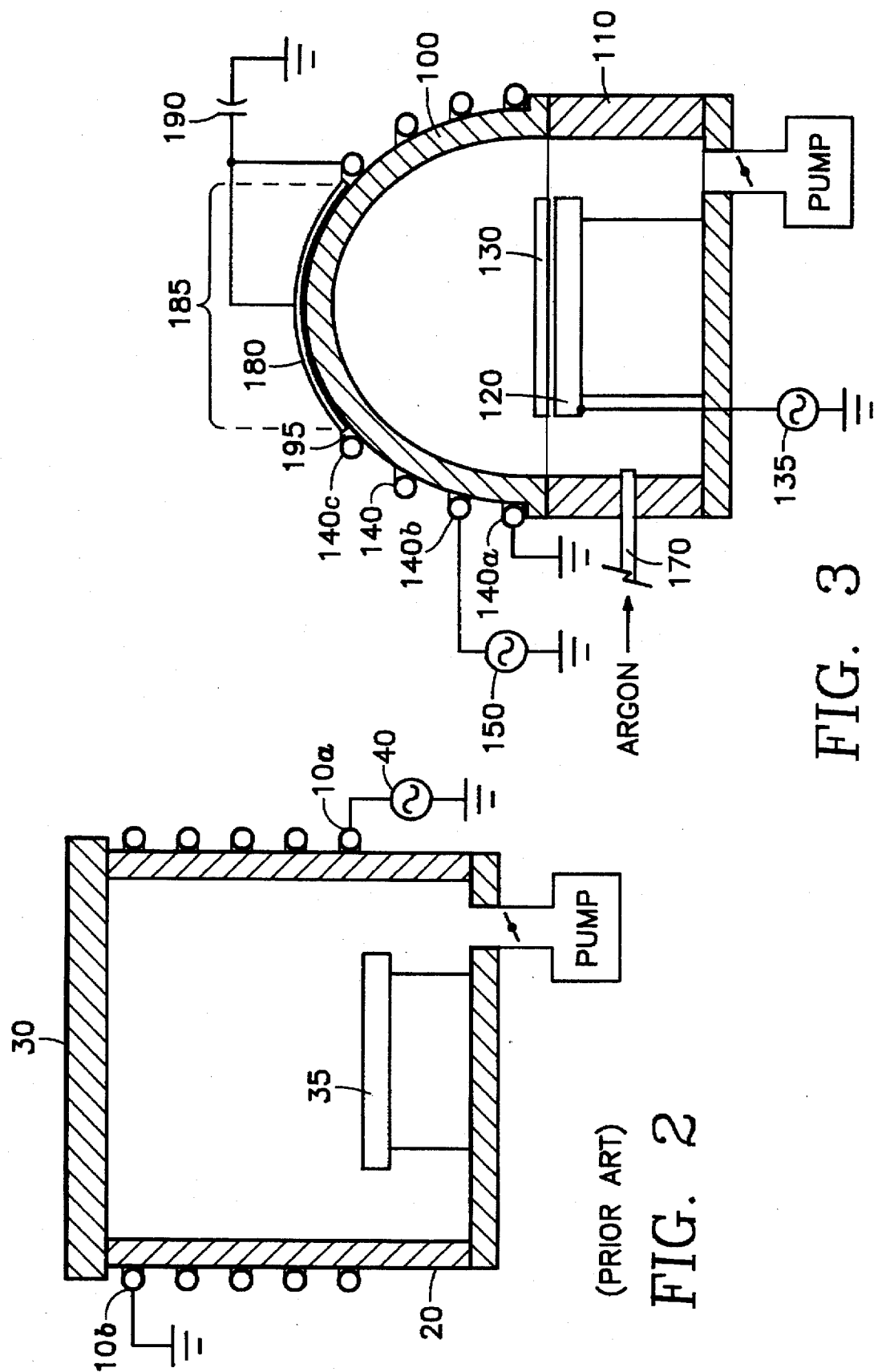

5,685,941

INDUCTIVELY COUPLED PLASMA REACTOR WITH TOP ELECTRODE FOR ENHANCING PLASMA IGNITION

This is a continuation of application Ser. No. 08/252,963, filed Jun. 2, 1994.

BACKGROUND OF THE INVENTION

1. Technical Field

The invention is related to inductively coupled plasma processing reactors of the type employed in semiconductor wafer fabrication, and in particular to apparatus for reliably igniting a plasma in such a reactor to carry out semiconductor wafer plasma processes which are best carried out at very low pressures (for example, processing pressures below 100 milliTorr and as low as on the order of 0.5 milliTorr).

2. Background Art

Physical vapor deposition processes are best carried out by first performing a "pre-clean" etch step in which the surface to receive the deposition is etched, preferably with an Argon plasma sputter etch process. In such a process, the etch is carried out by Argon ions in the plasma bombarding or sputtering the surface to be cleaned. The etch rate is directly related to the ion density of the plasma, and requires very high ion densities in order to achieve reasonable etch rates. Since inductively coupled plasmas provide the highest ion densities, such etch processes are typically carried out with inductively coupled plasma reactors. In an inductively coupled plasma reactor, plasma ion density is maximized by operating at a very low pressure regime, typically between 0.5 and 100 milliTorr. For the Argon plasma sputter etch process mentioned above, the ideal pressure is about 0.5 milliTorr. Other plasma processes which are best carried out at low pressure, e.g., between 1 milliTorr and 100 milliTorr, include polysilicon etching, metal etching, oxide etching and high density plasma chemical vapor deposition.

Ignition of a plasma is unreliable in a typical inductively coupled plasma reactor because it is difficult to couple to the plasma an ignition voltage high enough to excite the plasma. Specifically, very low chamber pressures, typically about 0.5 milliTorr, are necessary to achieve high plasma density in the region adjacent the semiconductor substrate and to maximize anisotropy of the sputter etch, but the voltage necessary to ignite the plasma undesireably increases with decreasing chamber pressure.

Unfortunately, in an inductively coupled plasma reactor the very low chamber pressure and the lack of capacitive coupling make it very difficult to ignite a plasma in the chamber. FIG. 1 is a graph of breakdown voltage required to ignite a plasma as a function of vacuum chamber pressure for a discharge length of about 1.0 cm. This graph indicates that the optimum pressure for plasma ignition is on the order of about 500 milliTorr, and that below 400 milliTorr the breakdown voltage increases very fast as pressure is reduced. At the low pressure (i.e., 0.5 milliTorr) required for argon sputter etching, the required breakdown voltage may be close to or even exceed the capacity of the RF power source of the induction coil, making plasma ignition unreliable. As a result, it may be necessary to make several attempts to ignite a plasma, greatly reducing the productivity of the plasma reactor.

FIG. 2 illustrates an inductively coupled plasma reactor of the prior art useful for argon plasma sputter etch processing having a cylindrical induction coil 10 around a cylindrical quartz reactor chamber 20 and lid 30, one end 10a of the coil being connected to an RF source 40 through a suitable RF matching network and the other end 10b being grounded. Plasma ignition relies upon the electrical potential between the "hot" end 10a of the coil 10 and the nearest grounded conductor in the chamber, such as the wafer pedestal 35. Thus, the discharge length is the distance between the hot coil end 10a and the nearest surface of the wafer pedestal 35.

A conventional technique for meeting the power requirement for plasma ignition is to connect an auxiliary RF power source to the induction coil during plasma ignition, but this requires additional hardware and expense.

Another conventional technique is to temporarily raise the chamber pressure when igniting the plasma and then, after the plasma is ignited, quickly reduce the chamber pressure to the desired processing pressure. However, pumping down the chamber pressure after plasma ignition (e.g., from 10 milliTorr during ignition to 0.5 milliTorr after ignition) requires a significant amount of time, during which the etch process will be carried out at a higher than ideal pressure, thereby causing poor etch profiles. Also, the necessary time to pump down will adversely affect throughput of the etch reactor.

Yet another conventional approach is to temporarily increase capacitive coupling during ignition by applying RF power to the wafer pedestal. However, this tends to create a large spike in the D.C. bias on the wafer during plasma ignition, increasing the risk of wafer damage.

U.S. Pat. No. 4,918,031 discloses how to introduce a so-called Faraday shield between the entire induction coil 10 and the plasma in the reactor of FIG. 2 (discussed above) and apply a separate electrical power source to the Faraday shield in order to control the electrical potential of the plasma or to ground the Faraday shield in order to suppress capacitive coupling by shielding the plasma from electric fields. A disadvantage of this technique is that it either unduly increases capacitive coupling to the plasma if used to increase the plasma potential, thereby reducing the control over ion energy, or else, if grounded, it cuts off whatever capacitive coupling from the induction coil may exist, thereby making plasma ignition less reliable or more difficult.

Accordingly, there is a need to perform reliable plasma ignition for low pressure plasma processing without requiring a temporary pressure increase or temporary RF power increase.

SUMMARY OF THE INVENTION

A plasma reactor for carrying out plasma processing of a semiconductor substrate includes a vacuum chamber including apparatus for introducing a gas into the interior thereof, an induction coil encircling a region of the vacuum chamber, the coil being connected across an RF power source, and an electrode positioned adjacent the region and connected to the RF power source for capacitively coupling RF power to the gas in the interior of the vacuum chamber. The electrode has a surface area facing the region which is large enough to provide capacitive coupling of RF power to the gas in the region sufficient to facilitate igniting a plasma, but which is small enough so that, during steady-state maintenance of the plasma, most of the RF power coupled to the plasma from the RF power source is coupled inductively rather than capacitively.

The surface area of the electrode is large enough to provide capacitive coupling sufficient to achieve plasma ignition at a much lower chamber pressure and/or RF power level on the induction coil than would be required without the auxiliary electrode, but preferably the surface area is no larger than necessary to achieve such a result. Preferably, the surface area is large enough so that plasma ignition scan occur when either (or both) (a) the chamber pressure is the same or slightly greater than that used during plasma processing of the wafer or (b) the RF power level is no greater than that used during plasma processing of the wafer. Specifically, at a power level on the order of 255 Watts, we have found that our auxiliary electrode enables plasma ignition to reliably occur when the chamber pressure is below 100 milliTorr and in some cases as low as 0.5 milliTorr.

Conversely, the surface area of the electrode preferably should be no greater than necessary to achieve plasma ignition at a desired reduced chamber pressure and/or reduced power level. Such minimizing of the surface area of the auxiliary electrode minimizes the diversion of RF power from inductive coupling to capacitive coupling, thereby avoiding an undue loss of plasma ion density during wafer processing after plasma ignition.

In a certain preferred embodiment of the invention, the electrode is a conductive layer around the vacuum chamber.

BRIEF DESCRIPTION OF THE DRAWINGS

FIG. 2 is a simplified diagram of an inductively coupled plasma reactor of the prior art having a cylindrical induction coil.

FIG. 3 is a simplified cut-away side view of a portion of a plasma reactor embodying the present invention.

DETAILED DESCRIPTION OF THE PREFERRED EMBODIMENTS

Figure 1:
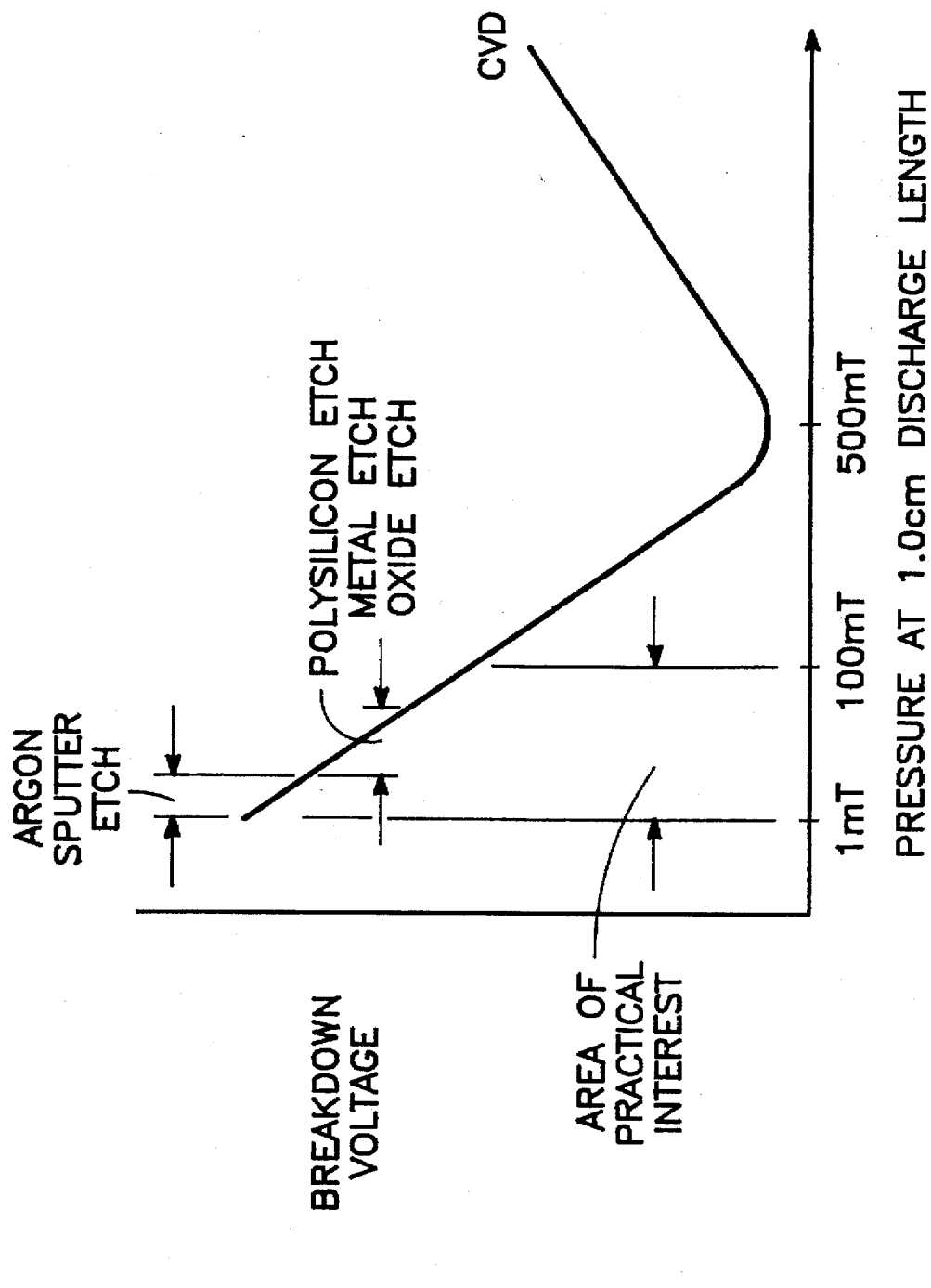
FIG. 1 is a Paschen curve or graph of breakdown voltage as a function of the product of vacuum chamber pressure and discharge length in a plasma reactor.

Referring to FIG. 3, an inductively coupled plasma reactor has a vacuum chamber including a dome shaped ceiling 100 of an insulating material such as quartz, and a cylindrical side wall 110. The base of the dome rests on the top of the cylindrical side wall 110 and has the same diameter as the cylindrical side wall. The reactor includes a wafer pedestal 120 for holding a semiconductor wafer or substrate 130 in the middle of the chamber for plasma processing. A gas inlet 170 supplies gas such as Argon to the interior of the vacuum chamber. An inductor coil or conductor 140 is wound around the outside of the dome 100. A lower end 140a of the inductor coil 140 is grounded.

An RF power source 150 can be connected through a conventional RF matching network, not shown. Alternatively, in the illustrated preferred embodiment, the RF power supply is connected to a tap at a middle winding 140b of the inductor coil 140, and a capacitor 190 is connected across the inductor, the capacitor value being chosen to resonate with the inductor at the frequency of the RF power source 150. The position of the tap 140b is chosen to match the output impedance of the RF power source 150. RF power from the source 150 is inductively coupled to a plasma formed by ionizing the gas inside the vacuum chamber.

A wafer pedestal 120 supports an 8-inch wafer 130 in the middle of the vacuum chamber. The wafer pedestal includes conductive material and may be either grounded (e.g., during plasma ignition) or connected to a bias RF power source 135 to control kinetic energy of the plasma ions near the wafer 130 during processing.

The preceding components of the plasma reactor are conventional. According to our invention, the chamber further includes an auxiliary electrode 180 which enhances the reliability of plasma ignition at a very low chamber pressure. The auxiliary electrode 180 is connected to the top winding 140c of the induction coil 140. The auxiliary electrode 180 capacitive couples RF power to gases inside the vacuum chamber to enhance plasma ignition. In the illustrated preferred embodiment, the auxiliary electrode 180 is a thin conductive film deposited on the exterior surface of the dome 100.

The electrode has a surface area facing the interior of the chamber which is large enough to provide sufficient capacitive coupling of RF power to the argon process gas to facilitate igniting a plasma, but which is small enough so that, during steady-state maintenance of the plasma, most of the RF power coupled to the plasma from the RF power source is coupled inductively rather than capacitively.

The surface area of the auxiliary electrode 180 is large enough to provide capacitive coupling sufficient to achieve plasma ignition at a much lower chamber pressure and/or RF power level on the induction coil than would be required without the auxiliary electrode, but preferably the surface area is no larger than necessary to achieve such a result. Preferably, the surface area is large enough so that plasma ignition can occur when either (or both) (a) the chamber pressure is the same or slightly greater than that used during plasma processing of the wafer or (b) the RF power level is no greater than that used during plasma processing of the wafer. Specifically, at a power level on the order of 225 Watts, we have found that our auxiliary electrode enables plasma ignition to reliably occur when the chamber pressure is below 100 milliTorr and in some cases as low as 0.5 milliTorr.

Conversely, the surface area of the auxiliary electrode 180 preferably should be no greater than necessary to achieve plasma ignition at a desired reduced chamber pressure and/or reduced power level. Such minimizing of the surface area of the auxiliary electrode minimizes the diversion of RF power from inductive coupling to capacitive coupling, thereby avoiding an undue loss of plasma ion density during wafer processing after plasma ignition.

Figure 5:
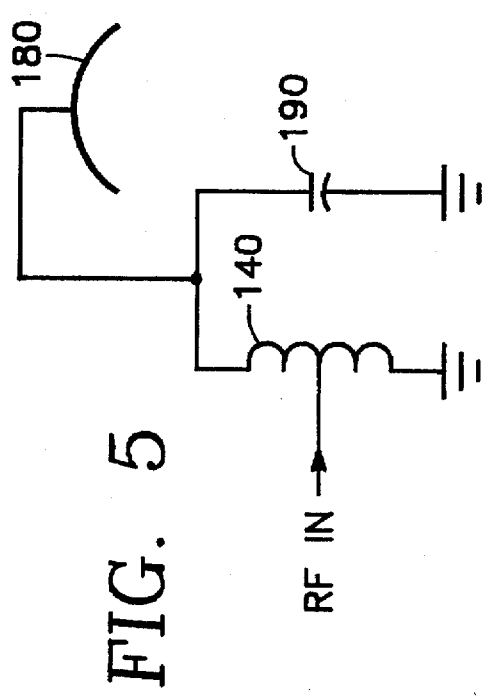
FIG. 5 is a schematic diagram of an equivalent circuit corresponding to the induction coil and auxiliary electrode of the reactor of FIGS. 6 and 7.

In order to limit capacitive coupling from the auxiliary electrode 180, in the preferred embodiment the electrode 180 is implemented as four arms 184 (FIG. 4) where the width of each arm 184 is less than 5% of the circumference of the bottom of the dome 100 so that the area of the auxiliary electrode 180 is not more than 10% of the area of the induction coil 140. In the embodiment illustrated, the arms 184 have a constant width. In an alternative embodiment, the width of each arm 184 may increase from a minimum width near the connection center 182 at the apex of the dome 100 to a maximum width at the end 184a of each arm 184. The electrical equivalent circuit is illustrated in FIG. 5. In the following working examples, the vacuum chamber dome was a half-sphere about 30 cm in diameter, the connection center 182 had a diameter of about 7.6 cm and each arm 184 was about 15 cm long with a constant width of about 5 cm.

Figure 4:
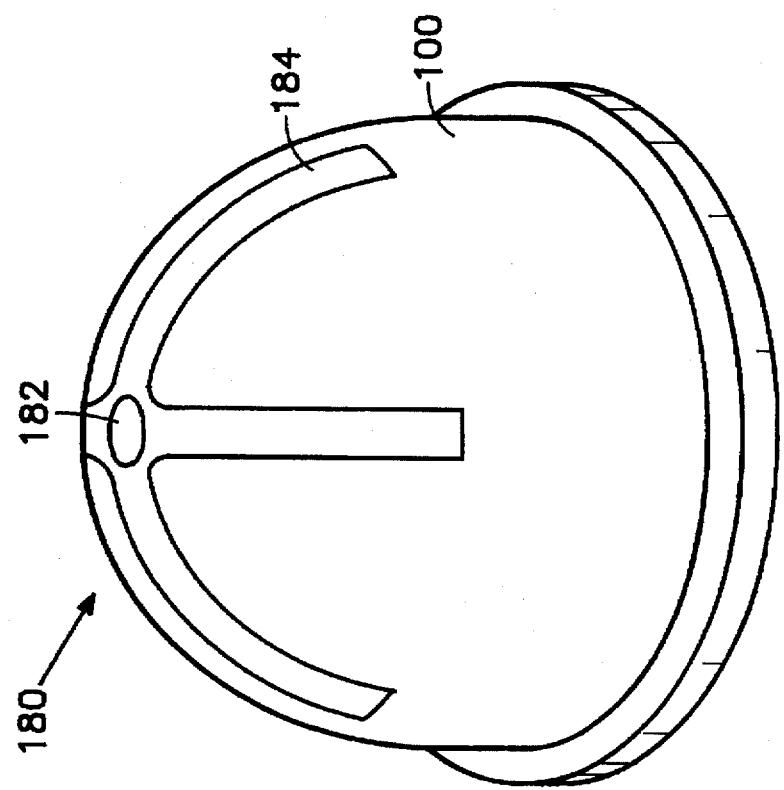
FIG. 4 is a perspective top view of a portion of the plasma reactor of FIG. 3.

In order to avoid shorting the RF field out to the auxiliary electrode 180, the auxiliary electrode is configured so as to not provide a closed conducting path in the direction of the circumference of the induction coil 140. Specifically, FIG. 4 shows that the auxiliary electrode 180 has a small circular connection center 182 at its top on the apex of the dome 100, with the four narrow arms 184 connected to and symmetrically extending out from the connection center 182 and under the induction coil windings. Since the circular connection center 182 itself presents a closed conductive path, it is placed at the dome apex, where there is an opening 185 in the induction coil 140, so that the circular connection center 182 is not between any induction coil windings and the vacuum chamber. Only the arms 184 extend between the induction coil windings and the vacuum chamber. The spaces separating adjacent arms 184 prevent a closed conducting path around the circumference of the induction coil 140 (to avoid shorting the RF field from the coil, as mentioned above).

WORKING EXAMPLE 1

Figure 6:
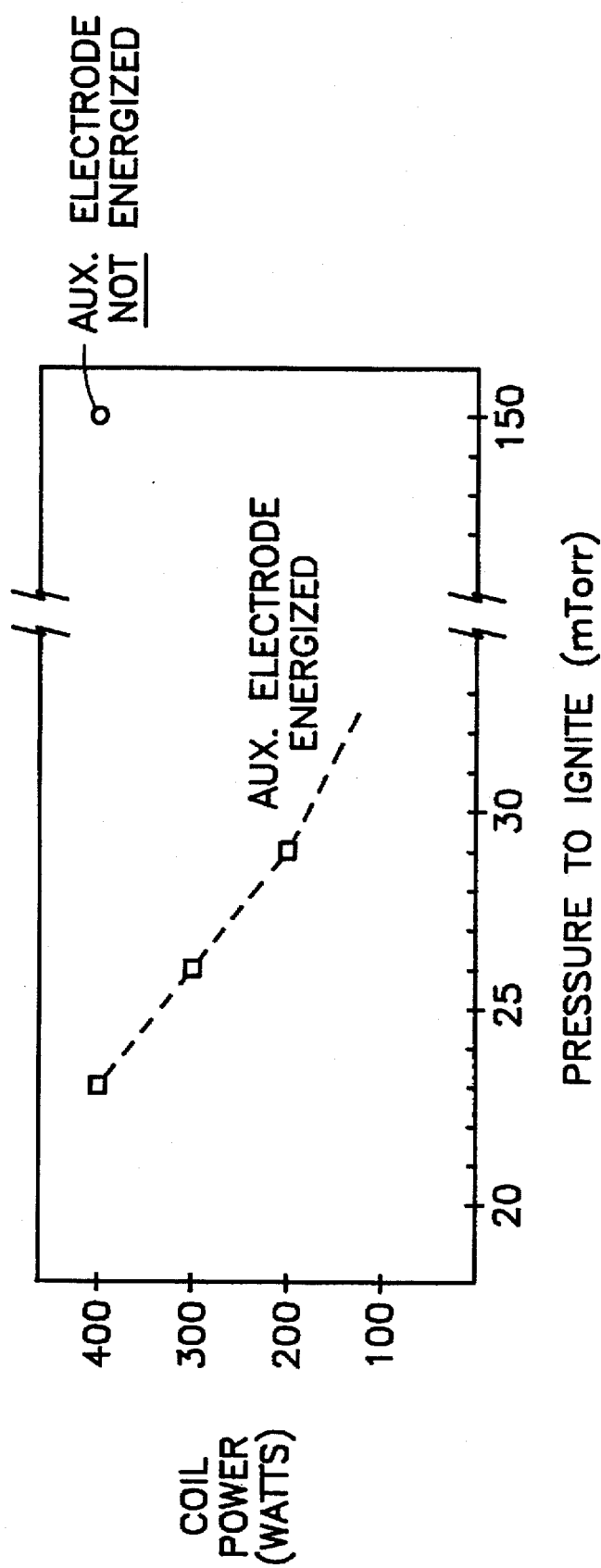
FIG. 6 is a graph of the induction coil RF power required to ignite a plasma in a reactor of FIG. 3 as a function of chamber pressure with power applied to the auxiliary electrode (dashed line curve) and without power applied to the auxiliary electrode.

In one experimental implementation of the present invention, the vacuum chamber had a volume on the order of about 35 liters, Argon gas flow rate into the chamber was 5 standard cubic centimeters per minute (SCCM's) and the chamber pressure was 0.5 milliTorr during processing. 225 Watts at 400 kHz was supplied by the RF power source 150 to the induction coil 140 while 225 Watts at 13 MHz was applied by the bias RF power source 135 to the wafer pedestal 120 during processing. FIG. 6 illustrates the minimum chamber pressure for plasma ignition as a function of RF power in accordance with data obtained from the experimental implementation of the invention with a greater chamber pressure at ignition than the desired processing pressure and with the wafer pedestal grounded during plasma ignition by turning off the power supply 135. The dashed line indicates the data points obtained with the auxiliary electrode 180 connected to the induction coil 140, clearly demonstrating that plasma ignition may be obtained at pressures between 20 and 30 milliTorr. In contrast, the data point in the upper right corner of the graph of FIG. 6 demonstrates that, without the auxiliary electrode and for the same plasma reactor, a vacuum chamber pressure exceeding 100 milliTorr is required for plasma ignition at the same RF power level (400 Watts) at which plasma ignition was obtained with the auxiliary electrode at only 23 milliTorr. This indicates that the invention reduces the required chamber pressure for plasma ignition by at least a factor of five.

WORKING EXAMPLE 2

Using the same experimental implementation of the invention, plasma ignition was carried out without increasing chamber pressure above the desired processing pressure (i.e., 0.5 milliTorr) by applying the same RF power to the induction coil (i.e., 225 Watts at 400 kHz) and wafer pedestal (i.e., 225 Watts at 13 MHz) during plasma ignition as is used during wafer processing. The provision, in this second example, of RF power on the wafer pedestal enabled plasma ignition to be accomplished at a lower chamber pressure than in the previous example. However, as noted above, applying RF power to the wafer pedestal during ignition risks generating spikes in the wafer DC potential, although such a risk may be acceptable in certain applications.

In the present example, we found that the DC voltage on the wafer was, on the average, 20% greater with the auxiliary electrode than without, indicating an increase in capacitive coupling of RF power to the plasma, from which a decrease in etch rate is to be expected. Indeed, a 10% decrease in the average etch rate was observed with introduction of the auxiliary electrode. Two countervailing factors enter into this decrease in etch rate: (1) the decrease in the ratio of inductive coupled power to capacitively coupled power, tending to decrease plasma ion density (and therefore tending to decrease etch rate) and (2) an increase in ion energy due to increased DC bias voltage on the wafer caused by increased capacitive coupling (tending to increase the etch rate, assuming all other factors are unchanged). Obviously, the dominating factor was the decrease in plasma ion density, judging from the observed decrease in etch rate.

The actual results of this experiment may be summarized as follows: With the auxiliary electrode and coil connected to 225 Watts of RF power at 400 kHz, as mentioned above, the average DC bias voltage on the wafer was about 327 volts, average etch rate was about 326 angstroms per minute and the etch rate uniformity across the wafer was about 1.66. With the auxiliary electrode disconnected, the average DC bias voltage on the wafer was about 284 volts, the etch rate was about 342 angstroms per minute and the etch rate uniformity across the wafer was about 2.075.

We feel that the foregoing experiments showed that the advantage of the invention, namely a five-fold reduction in required chamber pressure during plasma ignition, far outweighed the fractional loss in etch rate (i.e., 10%) occasioned by the introduction of the auxiliary electrode.

Preferably, the windings of the induction coil 140 are sufficiently spaced from the external surface of the dome 100 to accommodate the auxiliary electrode 180 between the induction coil 140 and the dome. While FIG. 3 indicates that the induction coil is dome-shaped, the invention may be implemented with a cylindrical shaped coil. Since the auxiliary electrode 180 of FIG. 3 may constitute a relatively thin conductive film on the external surface of the ceiling 100, the space between the induction coil 140 and the ceiling 100 may be relatively small. The space or gap 195 between the induction coil and the connection center 182 is sufficient to avoid arcing therebetween. The thin conductive film constituting the auxiliary electrode 180 may be either a thin deposited metal layer or may be metal foil (such as aluminum foil) bonded to the exterior of the ceiling 100. The latter alternative (aluminum foil) was employed in the foregoing working examples.

Figure 7:
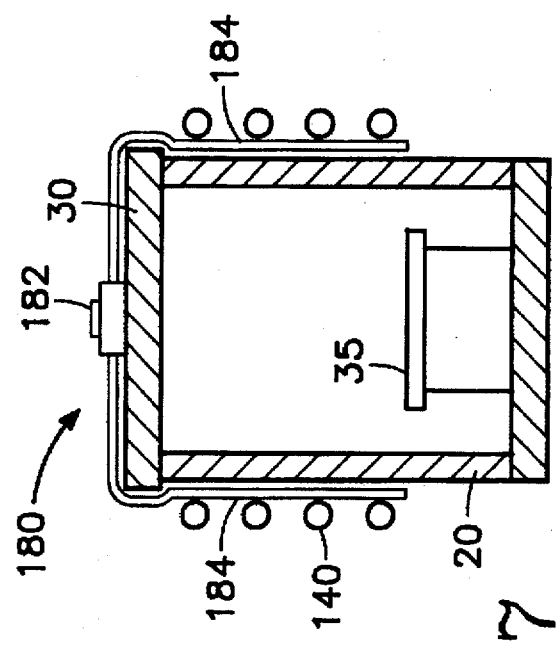
FIG. 7 is a simplified cut-away view of an embodiment of the invention having a cylindrical induction coil wound around a cylindrical vacuum chamber.

While the invention has been described with reference to a preferred embodiment in which the vacuum chamber has a dome, the invention can be implemented with the cylindrically-shaped vacuum chamber and induction coil of FIG. 1. In this case, the connection center 82 can be located in the center of the top lid and the arms 84 preferably extend radially outwardly to the edge periphery of the lid and then vertically downward along the side edges of the cylindrical chamber wall between the cylindrical chamber wall and the cylindrically-wound induction coil, as shown in FIG. 7.

While the invention has been described in detail by specific reference to preferred embodiments, it is understood that variations and modifications thereof may be made without departing from the true spirit and scope of the invention.

What is claimed is:

1. A plasma reactor for carrying out plasma processing of a semiconductor substrate, comprising:

a vacuum chamber including means for introducing a gas into the interior thereof;

an induction coil facing a region of said vacuum chamber, said coil being connected across an RF power source and an integrated auxiliary electrode electrically connected at a portion of said induction coil with a potential sufficient to facilitate igniting a plasma; and wherein said auxiliary electrode is located adjacent said region and connected to said RF power source for capacitively coupling RF power to said gas in said vacuum chamber, said auxiliary electrode having a surface area facing said region and covering an area of said region suitable to limit capacitive coupling of RF power to said gas in said vacuum chamber to a level which is still sufficient to facilitate igniting a plasma so that, during steady-state maintenance of the plasma, most of the RF power coupled to the plasma from said RF power source is coupled inductively rather than capacitively.

2. The plasma reactor of claim 1 wherein a first portion of said auxiliary electrode lies between said induction coil and said vacuum chamber, said first portion having at least an aperture therein to prevent a closed conductive path around said inductive coil.

3. The plasma reactor of claim 2 wherein said coil comprises a first terminal connected to an energized terminal of said RF power source and a second terminal which is grounded, and wherein said auxiliary electrode further comprises a second portion connected to said induction coil between said first and second terminals.

4. The plasma reactor of claim 3 wherein:

said second portion of said auxiliary electrode comprises a center connection region; and said first portion of said auxiliary electrode comprises plural arms separated by apertures therebetween and radiating outwardly from said center connection region and across said induction coil.

5. The plasma reactor of claim 4 wherein said center connection region is a closed circular conductive disk, said inductive coil having an opening therethrough near the center thereof, said center connection region being in registration with said opening of said induction coil so as to avoid being between said induction coil and the interior of said vacuum chamber.

6. The plasma reactor of claim 5 wherein said vacuum chamber comprises a sealed container having a circular cross-sectional shape and a top centered at an axis of symmetry of said circular cross-sectional shape, said induction coil being wound around said sealed container so that said opening of said induction coil coincides with said top of said sealed container, and wherein said center connection region of said auxiliary electrode is on said top and centered at said axis of symmetry.

7. The plasma reactor of claim 6 wherein said auxiliary electrode comprises a film deposited on an exterior surface of said sealed container.

8. The plasma reactor of claim 6 wherein said sealed container comprises a dome and wherein said top comprises an apex of said dome, and wherein arms of said auxiliary electrode extend downwardly from said apex.

9. The plasma reactor of claim 8 wherein each of said arms has a width less than 5% of the circumference of the base of said dome.

10. The plasma reactor of claim 8 wherein said induction coil is wound around a lower portion of said dome so as to leave said opening therethrough centered at said apex of said dome.

11. The plasma reactor of claim 10 wherein said induction coil is spaced from said dome to accommodate said second portion of said auxiliary electrode therebetween.

12. The plasma reactor of claim 1 further comprising a capacitor having one side thereof connected to said auxiliary electrode.

13. The plasma reactor of claim 12 wherein an opposite side of said capacitor is connected to a ground terminal.

14. The plasma reactor of claim 1 further comprising:

a wafer pedestal in the interior of said vacuum chamber for supporting said semiconductor substrate thereon; and means for applying a selected electrical potential to said wafer pedestal.

15. The plasma reactor of claim 14 wherein said means for applying comprises means for applying a ground potential to said wafer pedestal during plasma ignition.

16. The plasma reactor of claim 14 wherein said means for applying comprises means for applying an RF bias power source to said wafer pedestal during plasma ignition.

17. The plasma reactor of claim 1 wherein said surface area of said auxiliary electrode is not more than 10% of that of said induction coil.

18. The plasma reactor of claim 6 wherein said vacuum chamber has a cylindrical shape and said induction coil is wound in a cylinder around at least a portion of said vacuum chamber.

19. The plasma reactor of claim 1 wherein the surface area of said auxiliary electrode covers an area suitable to limit capacitive coupling to an amount sufficient for plasma ignition at a selected pressure in said vacuum chamber at a selected RF power level of said RF power source.

20. The plasma reactor of claim 19 wherein at least one of said selected RF power level and said selected pressure is substantially less than that required for plasma ignition in an absence of said auxiliary electrode.

21. The plasma reactor of claim 19 wherein at least one of said selected RF power level and said selected pressure is not substantially greater than that employed during plasma processing of said wafer.

22. The plasma reactor of claim 21 wherein said selected pressure is in a range between 0.5 and 50 milliTorr.

23. The plasma reactor of claim 22 wherein said selected power level is on the order of 225 Watts.

24. A plasma reactor for carrying out plasma processing of a semiconductor substrate, comprising:

a vacuum chamber including means for introducing a gas into the interior thereof;

an induction coil surrounding a portion of said vacuum chamber, said coil being connected across an RF power source, and an integrated auxiliary electrode electrically connected at a portion of said induction coil with a potential sufficient to facilitate igniting a plasma; and wherein said RF powered auxiliary electrode has a surface area facing said interior of said vacuum chamber so as to capacitively couple RF power to the gas in said interior of said vacuum chamber said surface area of said auxiliary electrode being limited in area covering said chamber to limit capacitive coupling therefrom to said gas to an amount sufficient for plasma ignition at a selected pressure in said chamber.

25. The plasma reactor of claim 24 wherein said auxiliary electrode is limited in area in that it covers an area not more than 10% of that covered by said induction coil.

26. The plasma reactor of claim 24 wherein said selected pressure is on the order of less than 100 milliTorr.

27. The plasma reactor of claim 24 wherein said selected pressure lies in a range between on the order of approximately 0.5 milliTorr and 30 milliTorr.

28. The plasma reactor of claim 24 wherein said auxiliary electrode comprises a first portion lying between said induction coil and said vacuum chamber, said first portion having at least an aperture therethrough preventing a closed conducting path around said induction coil.

29. The plasma reactor of claim 28 wherein said induction coil has an opening therein in which windings of said induction coil are absent, said opening facing the interior of said vacuum chamber, and wherein said auxiliary electrode comprises a second portion from which said first portion radiates outwardly, said second portion being a closed surface and being in registration with said opening of said induction coil.

30. The plasma reactor of claim 29 wherein said second portion is connected to said RF power source.

31. The plasma reactor of claim 24 further comprising a capacitor having one side thereof connected to said auxiliary electrode and an opposite side of said capacitor connected to a ground terminal of said RF power source, said capacitor providing, in combination with said induction coil, resonance at a frequency of said RF power source.

32. The plasma reactor of claim 24 further comprising:

a wafer pedestal in the interior of said vacuum chamber for supporting said semiconductor substrate thereon; and means for applying a selected electrical potential to said wafer pedestal.

33. A plasma reactor for carrying out plasma processing of a semiconductor substrate, comprising:

a vacuum chamber including means for introducing a gas into the interior thereof;

an RF power source;

an induction coil facing a region of said vacuum chamber, said coil being connected across said RF power source, and an integrated auxiliary electrode electrically connected to a portion of said induction coil; and wherein said RF power source provides sufficient power to the electrode to ignite the plasma, and provides power to said induction coil;

wherein said auxiliary electrode has a surface area suitable to limit capacitive coupling of RF power to said gas in said vacuum chamber so that, during steady-state maintenance of the plasma, most of the RF power coupled to the plasma from said RF power source is coupled inductively rather than capacitively.

34. The plasma reactor of claim 33 wherein a first portion of said auxiliary electrode lies between said induction coil and said vacuum chamber, said first portion having at least an aperture therein to prevent a closed conductive path around said inductive coil.

35. The plasma reactor of claim 34 wherein said coil comprises a first terminal connected to an energized terminal of said RF power source and a second terminal which is grounded, and wherein said auxiliary electrode further comprises a second portion connected to said induction coil between said first and second terminals.

36. The plasma reactor of claim 35 wherein:

said second portion of said auxiliary electrode comprises a center connection region; and said first portion of said auxiliary electrode comprises plural arms separated by apertures therebetween and radiating outwardly from said center connection region and across said induction coil.

37. The plasma reactor of claim 36 wherein said center connection region is a closed circular conductive disk, said induction coil having an opening therethrough near the center thereof, said center connection region being in registration with said opening of said induction coil so as to avoid being between said induction coil and the interior of said vacuum chamber.

38. The plasma reactor of claim 37 wherein said vacuum chamber comprises a sealed container having a circular cross-sectional shape and a top centered at an axis of symmetry of said circular cross-sectional shape, said induction coil being wound around said sealed container so that said opening of said induction coil coincides with said top of said sealed container, and wherein said center connection region of said auxiliary electrode is on said top and centered at said axis of symmetry.

39. The plasma reactor of claim 38 wherein said auxiliary electrode comprises a film deposited on an exterior surface of said sealed container.

40. The plasma reactor of claim 39 wherein said sealed container comprises a dome and wherein said top comprises an apex of said dome, and wherein arms of said auxiliary electrode extend downwardly from said apex.

41. The plasma reactor of claim 39 wherein each of said arms has a width less than 5% of the circumference of the base of said dome.

42. The plasma reactor of claim 39 wherein said induction coil is wound around a lower portion of said dome so as to leave said opening therethrough centered at said apex of said dome.

43. The plasma reactor of claim 42 wherein said induction coil is spaced from said dome to accommodate said second portion of said auxiliary electrode therebetween.

44. The plasma reactor of claim 33 further comprising a capacitor having one side thereof connected to said auxiliary electrode.

45. The plasma reactor of claim 44 wherein an opposite side of said capacitor is connected to a ground terminal.

* * * * *